Aug. 1, 1967 D. E. SAWYER 3,334,280
WIDE BAND SEMICONDUCTOR DEVICE HAVING
HYPER-ABRUPT COLLECTOR JUNCTION
Filed Feb. 7, 1964 2 Sheets-Sheet 1

INVENTOR.
DAVID E. SAWYER
BY Robert J. Haase
ATTORNEY

INVENTOR.
DAVID E. SAWYER
BY
Robert J. Haase
ATTORNEY

United States Patent Office 3,334,280
Patented Aug. 1, 1967

3,334,280

WIDE BAND SEMICONDUCTOR DEVICE HAVING HYPER-ABRUPT COLLECTOR JUNCTION

David E. Sawyer, Northboro, Mass., assignor to Sperry Rand Corporation, Great Neck, N.Y., a corporation of Delaware Filed Feb. 7, 1964, Ser. No. 343,265
2 Claims. (Cl. 317—234)

The present invention generally relates to semiconductor devices whose operation depends upon the interaction of charge carriers with an electric field in the vicinity of a p-n junction and, more particularly, to a semiconductor device of such type wherein the electric field is shaped in a special manner by appropriate impurity distribution for operation over a wide band of frequencies.

The advent of optical masers and of high efficiency, quasi-monochromatic, electroluminescent devices has greatly stimulated interest in the problem of the detection of optical radiation. The use of optical frequencies for communication and radar systems imposes new and rigorous demands on the performance of signal receiving components for use in such systems. Of particular concern are the signal detectivity and information bandwidth capability of the optical radiation detectors. The aforesaid characteristics ultimately determine the maximum physical distance over which the system can operate and the maximum information capacity of the system.

It is a principal object of the present invention to provide a semiconductor device characterized by large information bandwidth capability.

Another object is to provide a hyper-abrupt junction semiconductor device having a large information bandwidth capability.

A further object is to provide a photodetector having a large information bandwidth capability.

Another object is to provide a photodetector characterized by a large signal detectivity-information bandwidth product.

These and other objects of the present invention, as will appear from a reading of the following specification, are achieved in the disclosed typical embodiment by the provision of a solid-state junction photodetector which produces output current as a result of the interaction of photon-liberated charge carriers (holes and electrons) with the internal junction field. The internal junction field results from the sum of the so called "built-in" voltage (generally a fraction of a volt) and the applied voltage. The shape of the junction field, on the other hand, is determined at the time of device fabrication by the spatial variation of the net fixed donor or acceptor atom concentration in the vicinity of the p-n junction transition. In accordance with the present invention, a hyper-abrupt spacial variation of impurity atom concentration is created at the junction. The hyper-abrupt junction differs from junctions commonly created in semiconductor devices in that the net fixed charge density of the hyper-abrupt junction decreases with distance from the junction in the direction of the less heavily doped side.

It has been found that the field shaping resulting from the creation of a hyper-abrupt junction provides for strong interaction between the charge carriers and the field within a distance which is a small fraction of the total field extent whereby the signal associated with carrier transit has a cut off frequency much greater than simply the reciprocal of the total transit time across the field. An important feature of the disclosed photodetector embodiment is its capability for the parametric amplification of the detected signal. The two capabilities of wide band operation and parametric amplification provide a device of superior signal detectivity-information bandwidth product.

For a more complete understanding of the present invention reference should be had to the following specification and to the appended figures of which:

FIGURE 1 is a depiction of a positive charge carrier (hole) moving in a one dimensional junction field;

FIGURE 2 comprises a set of solid line curves depicting the frequency response attributable to the hyper-abrupt junction of the present invention and two segmented line curves representing the frequency response attributable to conventional junctions;

All solid state junction photodetectors have a common basis of operation. That is, current flows in the detector output circuit because of the interaction of photon-liberated charge carriers (holes and electrons) with the internal junction field of the detector. The details of charge carrier-junction field interaction determine the ultimate response-time of a structure incorporating the junction. The ultimate response times and the corresponding maximum frequencies will be realized for structure in which the generation of the carriers occurs either at a field region boundary or within the field region itself. Frequency degradation results from those carriers which drift and diffuse to the field region from points outside the field region.

Figure 1:
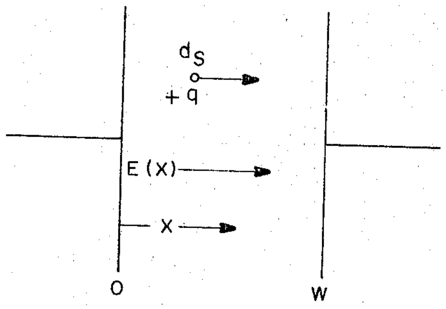

The analysis of the ultimate response time as determined by carrier field interaction is facilitated with the use of FIGURE 1. In FIGURE 1, the boundaries of the junction field are at $x=0$ and $x=w$. The work done on the single carrier of charge $q$ during its transit $ds$ is the product of the force $qE(x)$ and the distance $ds$:

$$w=qE(x)ds$$

Defining $ds/dt=v(x)$ the carrier velocity, the time-rate of change of $w$ is the power $dp$ supplied to the carrier:

$$dp=dw/dt=qE(x)ds/dt=qE(x)\cdot v(x)$$

For a spatial distribution of carriers $N(x)dx$, the total power supplied to these is $$p=\int_0^w dp=q\int_0^w E(x)\cdot N(x)\cdot v(x)\,dx$$

The two sources of $p$ per unit cross-sectional area are (1) the product of the voltage V across the junction and the external conduction current density $j$ and (2) the decrease in electrostatic energy of $c$ the capacitance of the junction per unit area. This decrease in electrostatic energy is $$d/dt(\tfrac{1}{2}cV^2)=cVdV/dt=Vj_c$$

where $j_c$ is the capacitive current density. Equating these two sources to the power dissipated within the field region $$V(j+j_o)=q\int_0^w E(x)\cdot N(x)\cdot v(x)dx$$

or, since $$V=-\int_0^w E(x)dx,\ j+j_o=-q\int_0^w E(x)\cdot N(x)\cdot V(x)dx\Big/\int_0^w E(x)dx \qquad (1)$$

To complete the specification of the amplitude and frequency behavior of the photocurrent, the integrals on the right-hand side of Equation 1 must be evaluated. The product $N(x) \cdot v(x)$ can be obtained from the appropriate solution of the well-known continuity equation $$\frac{\partial N}{\partial t} + \text{div. } (Nv) = g$$

where $g$ is the net volume rate of carrier generation within the junction. For the geometry diagrammed in FIGURE 1, and for the important case of $g=0$, we have $$\frac{\partial N}{\partial t} + N(x)\frac{\partial v(x)}{\partial x} + v(x)\frac{\partial N(x)}{\partial x} = 0 \qquad (2)$$

The solution of Equation 2 can be found using standard techniques and is $$N(x) \cdot v(x) = c_2 e^{c_1\left(\int_0^x \frac{dv}{d} - t\right)}$$

Practical cases for which $g \neq 0$ can also be solved readily. With a carrier flux $j_o$ modulated at an angular frequency $\omega$ entering at $x=0$, $c_2 = j_o$ and $c_1 = -i\omega$ and $$j_{\text{signal}} = qj_o \int_0^w E(x) e^{-i\omega\left(\int_0^w \frac{dv}{v} - t\right)} dx \Big/ \int_0^w E(x) dx \qquad (3)$$

junction fields can be sufficiently large in practice that the carriers everywhere in the junction can be considered as moving at a constant maximum velocity $v_M$. This further simplifies Equation 3 to $$j_{\text{signal}} = qj_o e^{i\omega t} \int_0^w E(x) e^{-i\omega x / v_m} dx \Big/ \int_0^w E(x) dx \qquad (4)$$

the quantity $E(x)$ is at the disposal of the junction fabricator, and is established by the applied voltage and Poisson's equation which relates the first derivative of the field, $E(x)$, with the local net fixed donor or acceptor charge density. Equation 4 also describes the amplitude and phase behavior of the equivalent signal source for time-varying junction fields. Such time-varying junction fields will result from combining photodetection and parametric amplification within a single-junction device. Thus, Equation 4 is vital for the theoretical study of parametric photodiodes. For this parametric case, the time-dependence of $E(x)$ is established by the pump source.

Figure 2:
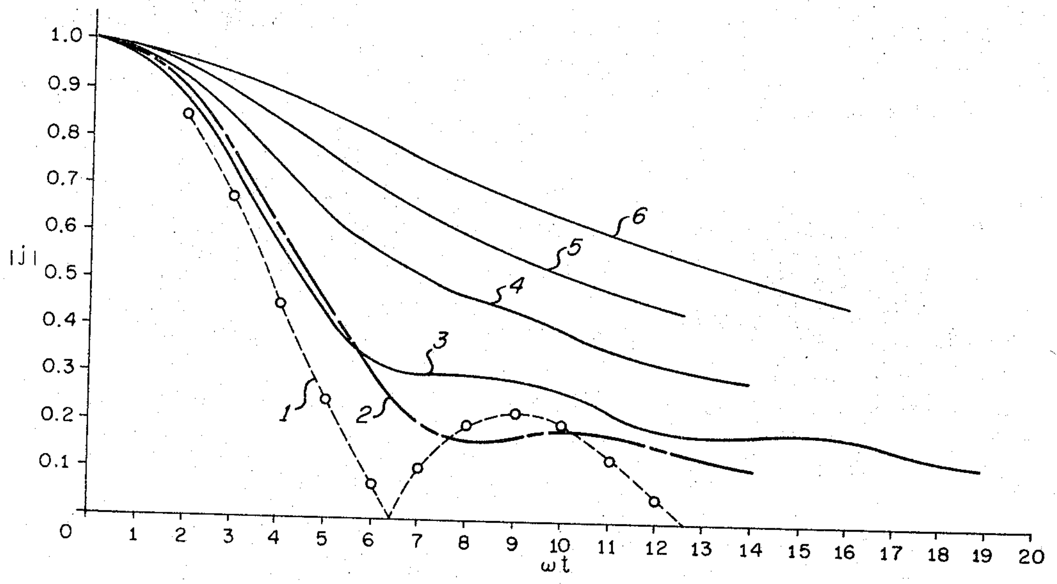

FIGURE 2 is a plot of Equation 4 in terms of signal current density $|j|$ versus the normalized frequency factor $\omega t$ for some junction field shapes. The dotted curve 1 and the broken curve 2 are related to a constant field and a parabolic field, respectively, which fields are common at conventional semiconductor junctions. The full line curves 3, 4, 5 and 6, on the other hand, result from hyper-abrupt junctions fabricated in accordance with the present invention. The hyper-abrupt collector junction differs from the prior art junctions to which curves 1 and 2 relate in that the net fixed charge density of the former decreases with increasing distance from the junction in the direction of the less heavily doped side. Comparing curve 1 with curve 6, it can be seen that a considerable improvement in frequency response may be achieved. In the case of curve 6, a 3000 to 1 ratio obtains between the next fixed (dopant) charge density at the junction edge $(x=0)$ and at the edge of the field region boundary $(x=w)$.

It has been shown in a very general manner that for a given semiconductor material the junction capacitance depends only on the distance $w$ between the field boundaries. Inasmuch as the curves of FIGURE 2 are for a constant distance $w$, it can be seen that the improvement in frequency response can be affected by field-shaping without incurring the penalty of increase in capacitance.

The improvement in intrinsic frequency response realized by the hyper-abrupt function field shaping technique of the present invention can be qualitatively understood in the following manner. As discussed in connection with FIGURE 1, the interaction of the charge carrier with the electric field is the basis of signal current flow. Only at times when the product of field strength and carrier velocity is relatively large does the carrier contribute a significant signal current. If the region of strong interaction is made a small fraction of the total field extent $w$, then the signal associated with carrier transit can have an angular cut off frequency much greater than simply the reciprocal of the total transit time across the field.

Figure 3A:
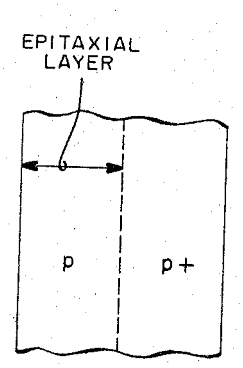
FIGURES 3A to 3F are plots representing typical impurity diffusion operations to create a hyper-abrupt junction.
Figure 3B:
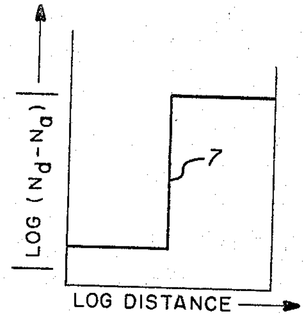
Figure 3C:
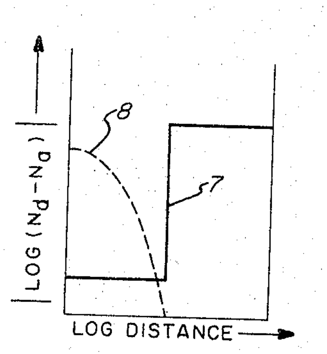
Figure 3D:
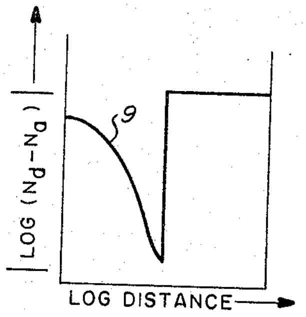
Figure 3E:
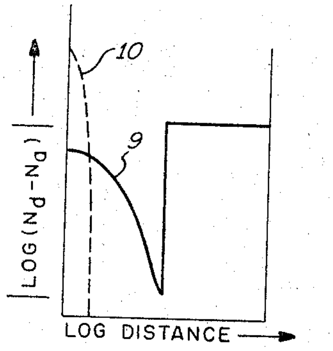
Figure 3F:
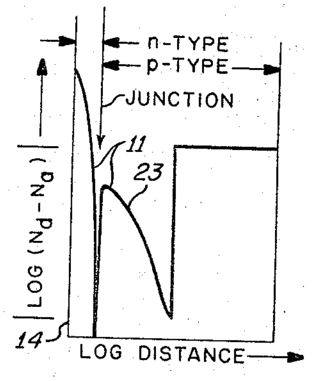

The manner in which a hyper-abrupt junction is produced in a typical wafer will now be described with the aid of FIGURES 3A to 3F. Starting with the epitaxial p-p+ wafer of FIGURE 3A having originally the acceptor dopant concentration represented by the plot 7 of FIGURE 3B, a dopant of the same type which predominates the wafer is diffused into the wafer. In the case where a silicon p-p+ wafer is employed, for example, the dopant may be boron. Appropriate conditions of surface concentration, temperature and time are employed to diffuse the dopant into the wafer to yield the impurity distribution represented by the curve 8 of FIGURE 3C which is superimposed upon the original impurity distribution 7. The resultant p-type impurity distribution 9 is depicted in FIGURE 3D. In the next step of the fabrication process, an n-type dopant (for example, phosphorous) is diffused into the p-p+ epitaxial wafer to create a shallow n-p junction. Curve 10 of FIGURE 3E represents the distribution of the n-type dopant which is made much steeper in slope than curve 9. This can be achieved, for example, by making the time duration of the second (n) diffusion considerably less than the time duration of the first (p) diffusion. The impurity distribution finally resulting from both diffusions is represented by curve 11 of FIGURE 3F. The point (not shown) on curve 11 where $(N_d - N_a)$ equals zero represents the location of the p-n junction relative to the edge of the wafer represented by the vertical line 14 through which the impurities are diffused. A unique feature of the hyper-abrupt junction represented by FIGURE 3F is that in the region 23 of the curve the net fixed charge density decreases approximately exponentially with increasing distance away from the junction.

As discussed previously, the hyper-abrupt junction of the present invention is applicable to all semiconductor devices which depend for their signal output current on the interaction of charged particles (electrons or holes) with an electric field. The collector junction of a transistor is such an interaction region. In the case of transistors, carriers are generated by the emitter junction. In the case of the disclosed photodetector, the carriers are generated by photon excitation.

Figure 5:
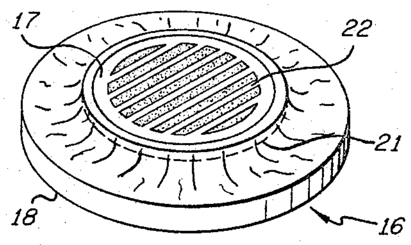
FIGURE 5 is an enlarged view of the photodiode active element utilized in the embodiment of FIGURE 4.
Figure 4:
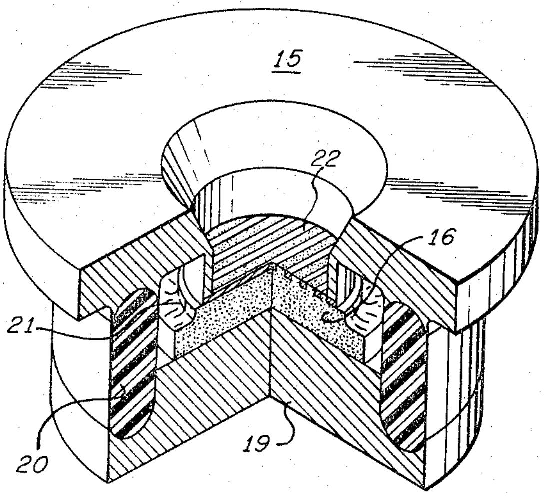
FIGURE 4 is a cut-away view of a preferred form of a typical photodiode fabricated in accordance with the present invention.

A packaged photodetector embodiment of the present invention is shown in FIGURE 4. The top package member 15 simultaneously serves as a package flange, an electrical terminal and a tube to delineate the photosensitive area of the detector die 16. Die 16 is shown more clearly in the enlarged view of FIGURE 5. The bottom surface 18 of the die 16 is bonded to the bottom package plate 19. The top and bottom package terminals are joined to the annular ceramic spacer 20.

The die is fabricated in accordance with a process such as described with reference to FIGURES 3A to 3F by which a doped wafer is first diffused with an impurity of the same type which predominates the wafer and then diffused with an impurity of the opposite type to form a shallow junction. The dotted line 21 represents the junction. A metallic grid pattern 22 is evaporated and alloyed to the die to reduce the lateral resistance of the n-region (assuming that the main body of the water is p-type) while allowing light to impinge on the surface of the die. The top package member 15 is bonded to the rim 17 of grid 22 to make electrical contact. Following the evaporation of the grid pattern on the die, the die is masked and etched just deeper than the n-region to produce the mesa shown. The packaged photodetector of FIG. 4 is similar in shape to a conventional varactor "pill" package and can be mounted conveniently in a standard coaxial holder.

A feature of the photodetector embodiment of the present invention is that not only is its frequency response substantially enhanced by the provision of the hyperabrupt junction but its signal sensitivity may be increased by the application of a pumping signal. By applying a pumping signal across the junction of the photodetector die, the combined functions of photodetection and parametric amplification can be achieved in a unitary solid-state device of small size, small and relatively simple power requirements and wideband frequency response.

While the invention has been described in its preferred embodiments, it is understood that the words which have been used are words of description rather than of limitation and that changes within the purview of the appended claims may be made without departing from the true scope and spirit of the invention in its broader aspects.

What is claimed is:

1. A photodetector having a large information bandwidth, said detector comprising:
a wafer of semiconductor material having a hyperabrupt junction formed therein beneath one surface of said wafer,
said junction being the boundary between a first region of one conductivity type and a second region of the opposite conductivity type,
the net fixed charge density increasing with distance from said junction in said first region,
the net fixed charge density first increasing with distance from said junction and then decreasing with greater distance from said junction in said second region,
gridded contact means on said surface of said wafer arranged to permit the impingement of light on said surface,
and electrical terminal means having an aperture for delineating the photosensitive area of said photodetector,
the periphery of said aperture being placed in contact with the periphery of said gridded contact means.

2. A photodetector having a large information bandwidth, said detector comprising:
a wafer of semiconductor material having a hyperabrupt junction formed therein beneath one surface of said wafer,
said junction being the boundary between a first region of one conductivity type and a second region of the opposite conductivity type,
the net fixed charge density increasing with distance from said junction in said first region,
the net fixed charge density first increasing with distance from said junction and then decreasing approximately exponentially with greater distance from said junction in said second region,
gridded contact means on said surface of said wafer arranged to permit the impingement of light on said surface,
and electrical terminal means having an aperture for delineating the photosensitive area of said photodetector,
the periphery of said aperture being placed in contact with the periphery of said gridded contact means.

References Cited

UNITED STATES PATENTS

| | | | |
|---|---|---|---|
| 2,899,646 | 8/1959 | Read | 317—234 |
| 3,201,664 | 8/1965 | Adam | 317—234 |
| 3,208,887 | 9/1965 | Anderson | 148—33 |

JOHN W. HUCKERT, *Primary Examiner.*

D. O. KRAFT, J. SHEWMAKER, *Assistant Examiners.*